United States Patent
Xu et al.

(10) Patent No.: US 7,417,503 B2
(45) Date of Patent: Aug. 26, 2008

(54) METHOD FOR HIGH EFFICIENCY AUDIO AMPLIFIER

(75) Inventors: Peng Xu, Santa Clara, CA (US); Wei Chen, Campbell, CA (US); James C. Moyer, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 76 days.

(21) Appl. No.: 11/252,218

(22) Filed: Oct. 17, 2005

(65) Prior Publication Data

US 2006/0082414 A1 Apr. 20, 2006

Related U.S. Application Data

(60) Provisional application No. 60/620,149, filed on Oct. 18, 2004.

(51) Int. Cl.
*H03F 3/217* (2006.01)
(52) U.S. Cl. .................................. 330/207 A; 330/251
(58) Field of Classification Search .................. 330/10, 330/207 A, 251
See application file for complete search history.

(56) References Cited

U.S. PATENT DOCUMENTS

| | | | |
|---|---|---|---|
| 4,354,064 A | 10/1982 | Scott | |
| 5,805,020 A * | 9/1998 | Danz et al. | 330/10 |
| 5,917,369 A | 6/1999 | Nguyen | |
| 5,945,877 A | 8/1999 | Elango et al. | |
| 6,420,930 B1 | 7/2002 | Takagishi | |
| 6,476,673 B2 | 11/2002 | Takagishi | |
| 6,489,841 B2 | 12/2002 | Takagishi | |
| 7,068,103 B2 * | 6/2006 | Lind | 330/251 |
| 7,113,030 B2 * | 9/2006 | Yang et al. | 330/10 |
| 7,142,050 B2 * | 11/2006 | Risbo | 330/10 |

* cited by examiner

*Primary Examiner*—Robert Pascal
*Assistant Examiner*—Hieu P Nguyen
(74) *Attorney, Agent, or Firm*—Perkins Coie LLP; Zhou Lu

(57) ABSTRACT

The present invention introduces methods and circuits to amplify audio signals for driving speakers. An additional feedback circuit is added in an audio amplifier to couple the amplifier stage and output stage of the audio amplifier. The feedback circuit turned off as long as output voltages of the audio amplifier are not near saturation. The feedback circuit is turned on to reduce audible noises if output voltages of the audio amplifier are near saturation.

21 Claims, 3 Drawing Sheets

METHOD FOR HIGH EFFICIENCY AUDIO AMPLIFIER

CROSS-REFERENCE TO RELATED APPLICATION

This application claims priority to U.S. provisional patent application Ser. No. 60/620,149, filed on Oct. 18, 2004, which is hereby incorporated herein by reference.

TECHNICAL FIELD

The present invention relates generally to audio signal processing, and in particular, relates to a system that includes a Class D amplifier for audio signal amplification and other audio signal processing.

BACKGROUND INFORMATION

Class-D audio amplifiers are often used for audio amplification because of their power efficiency. Typically, the Class D audio amplifier is operated in the switch mode with minimized internal power consumption. It produces a rectangular wave at the output stage that is filtered before delivered to a load. The filtered signal wave is an amplified version of the input signal wave. Class D audio amplifiers are usually used for high power applications. For low power applications, Class A/B amplifiers are still popular.

When the input audio signal exceeds the audio amplifier's linear range, the output of the amplifier saturates. Oscillations at the audible band are often observed when the amplifier enters the saturation condition and exits the saturation condition, as indicated in FIG. 3. This may result in the "clipping" of audible noises. This problem is more severe in the class D audio amplifier because the switching power supply can skip switching cycles due to the minimum on and off time constraints. If the power supply skips sufficient cycles, the effective operation frequency may enter the audible frequency range and induce unexpected audible noises.

There are several known methods to resolve the problem. The first method is to limit the amplitude of the input signal with a clamping circuit. However, without information on the audio source's output impedance, this may not be practical and can degrade the audio signal quality. The second method is to add an automatic gain control (AGC) pre-amplifier before the input of the class-D audio amplifier. This AGC pre-amplifier limits the input signal amplitude to prevent the output saturation, but the implementation is rather complex and adds a significant cost. The limitation may get more severe for low frequency audio signals. The third method is to add a high-pass filter to limit the minimum audio frequency passing into the class-D amplifier, but may not solve the problem completely.

Accordingly, more improvements are needed to reduce audio noise near saturation in the class D audio amplifier.

BRIEF DESCRIPTION OF DRAWINGS

The following figures illustrate embodiments of the invention. These figures and embodiments provide examples of the invention and they are non-limiting and non-exhaustive.

DETAILED DESCRIPTION

Embodiments of a system and method that uses an audio amplifier and accompanying circuitry to achieve highly efficient audio signal amplification and other audio signal processes are described in detail herein. In the following description, some specific details, such as example circuits and example values for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with systems, circuits, and methods that are meant to be exemplary and illustrative. In various embodiments, the above problem has been reduced or eliminated, while other embodiments are directed to other improvements.

The present invention relates to circuits and methods of high efficient audio signal amplification. Proposed circuits in an audio amplifier can detect output voltages in near saturation states, and adjust the close-loop gain of an amplifier control stage of the amplifier to prevent output voltages from "clipping" and remove audio signal oscillations near saturation.

Figure 1:
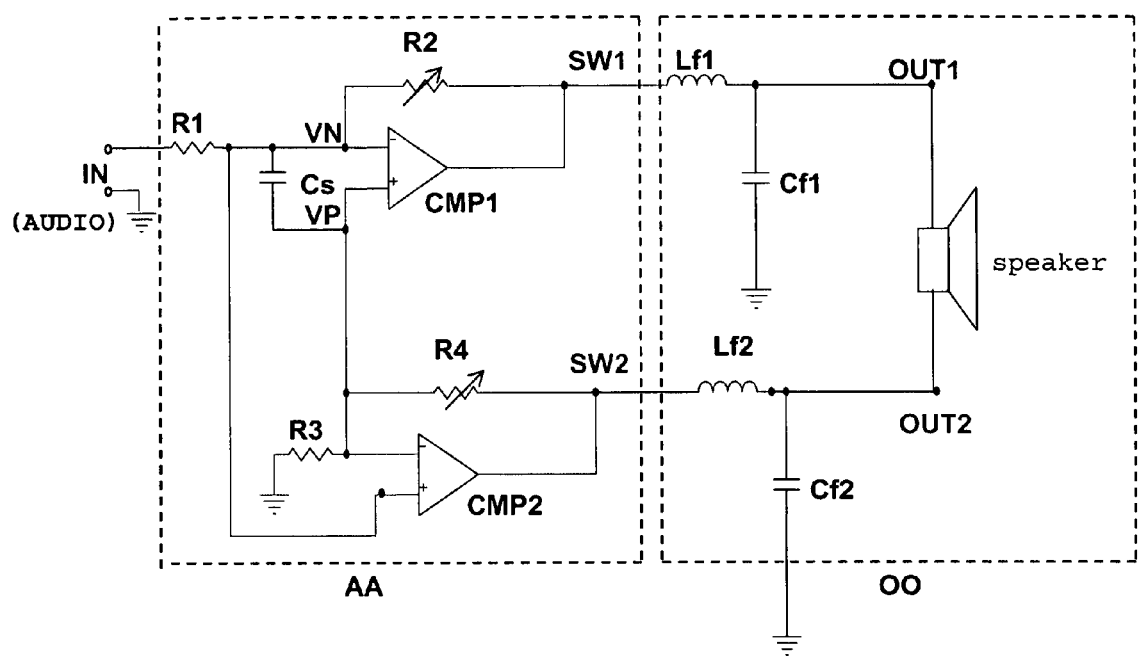
FIG. 1 shows simplified schematic diagram of a BTL Class D amplifier with proposed anti-saturation circuit.

FIG. 1 is an embodiment of a simplified system according to the invention. The system comprises an amplifier control stage, AA, and an output stage, OO.

In the amplifier control stage AA, an audio input signal is coupled to an input node, VN, through a resistor, R1. Ground is coupled to an input node, VP, through a resistor, R3. VN and VP are coupled by a capacitor, Cs. VN is the negative input terminal for a comparator, CMP1, and VN is also the positive input terminal for a comparator, CMP2. VP is the positive input terminal for CMP1, and VP is also the negative input terminal for CMP2. The output signal of CMP1 feeds back to VN through an adjustable resistor, R2. The output signal of CMP2 feeds back to VP through another adjustable resistor, R4.

The amplifier control stage and the output stage are coupled at nodes SW1 and SW2. In output stage, OO, a rectangular waveform at SW1 is filtered by an inductor, Lf1, and a capacitor, Cf1, being coupled to ground, and then delivered to an output node, OUT1. A rectangular waveform at SW2 is filtered by an inductor, Lf2, and a capacitor, Cf2, being coupled to ground, and then delivered to an output node, OUT2. The output stage OO further includes a speaker.

The output voltage of the system, the output voltage of CMP1, $V_{out1}$, and the output voltage of CMP2, $V_{out2}$, can be approximately expressed in the following equations:

Under conditions, $R1=R3=R_i$, $R2=R4=R_f$, $$V_{VN} = \frac{R_f}{R_i + R_f} V_{in} + \frac{R_i}{R_i + R_f} V_{out1} \quad (1)$$

$$V_{VP} = \frac{R_i}{R_i + R_f} V_{out2} \quad (2)$$

$$V_{VN} = V_{VP} \quad (3)$$

$$V_{out} = V_{out1} - V_{out2} = -\frac{R_f}{R_i} V_{in} \quad (4)$$

From Equations (4), the closed-loop gain of the amplifier is equal to $(R_f/R_i)$. In one embodiment of this invention, both R2 and R4 are adjustable if the output voltages at OUT1 and OUT2 are near saturation. Hence, the closed-loop gain of the amplifier is adjustable if the output signals at OUT1 and OUT2 are near saturation.

Figure 2:
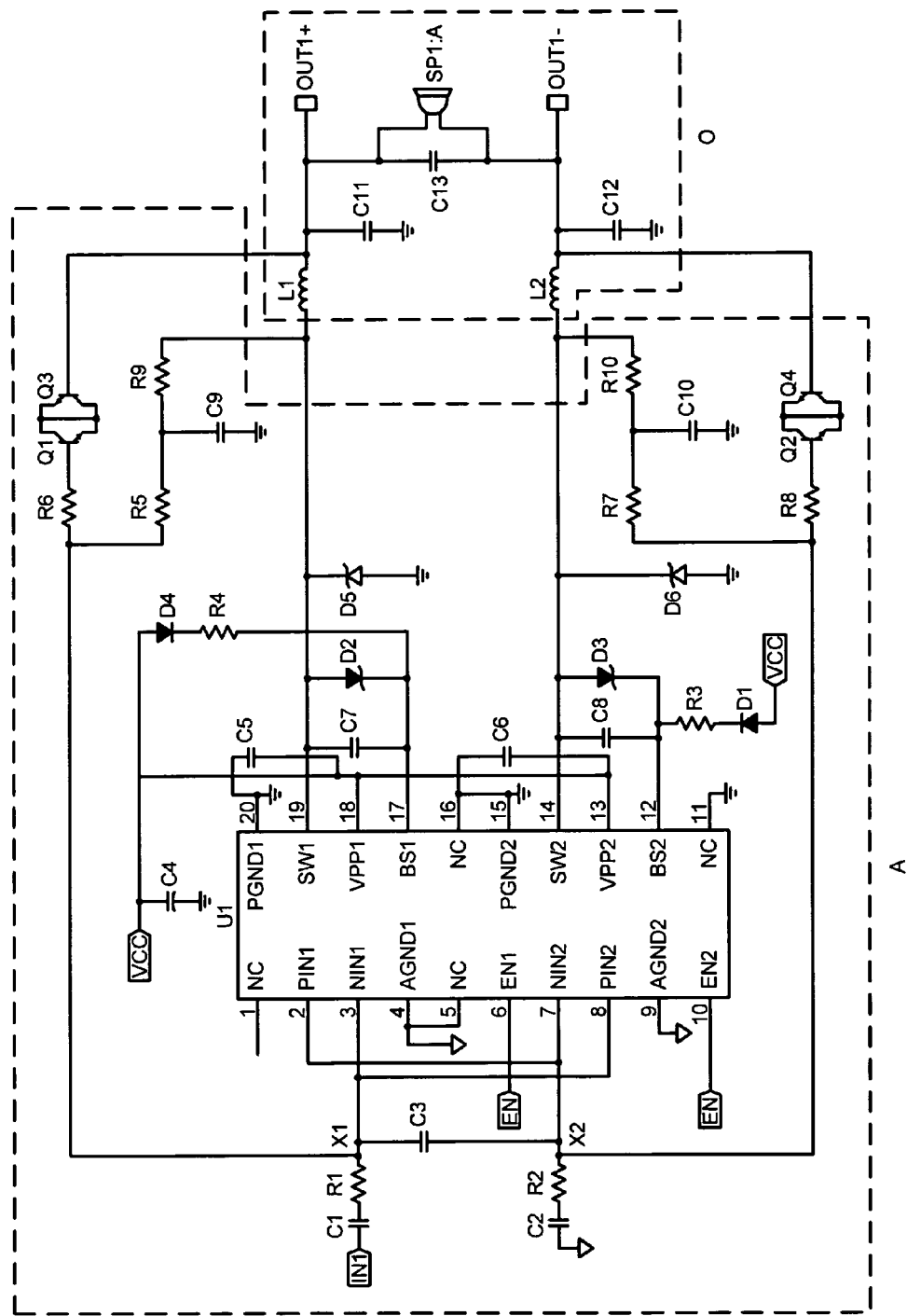
FIG. 2 is an example of the invention in a bridge tied load (BTL) Class D amplifier.
Figure 3:
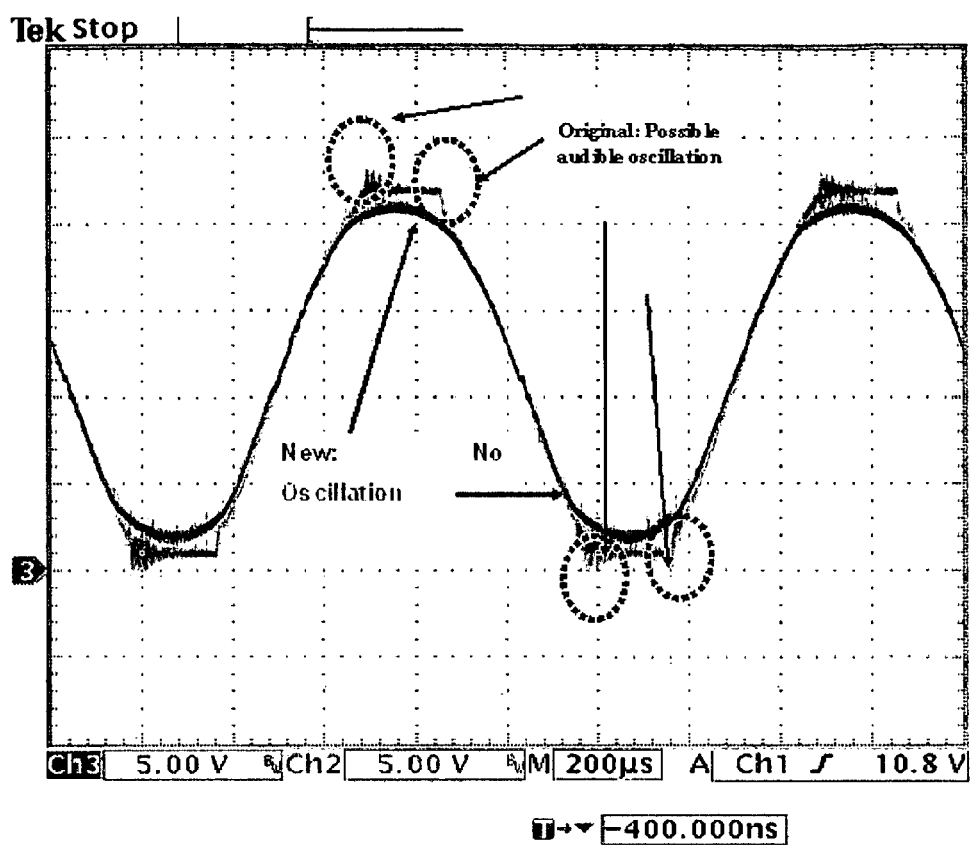
FIG. 3 shows output waveforms with and without the invention in the BTL Class D amplifier.

An example of embodiments is shown in a bridge tied load (BTL) Class D amplifier of FIG. 2. The system comprises a class D amplifier circuit A, and an output stage, O.

In the circuit A, an input signal is coupled to a node X1 through a capacitor, C1, and a resistor R1. Ground is coupled to a node X2 through a capacitor, C2, and a resistor R2. The capacitor, C1, is introduced to block DC components of input signal. The nodes, X1 and X2, are coupled by a capacitor, C3. The signal at a node SW1 is fed back to X1 through a resistor, R9, connected to a grounded capacitor, C9, and through a resistor, R5. The signal at a node SW2 is fed back to X2 through a resistor, R10, connected to a grounded capacitor, C10, and through a resistor, R7.

In output stage, O, a rectangular waveform at SW1 is filtered by an inductor, L1, and a capacitor, C11, which is coupled to ground, and then delivered to an output node, OUT1+. A rectangular waveform at SW2 is filtered by an inductor, L2, and a capacitor, C12, which is coupled to ground, and then delivered to an output node, OUT1−. The output stage O is used to drive a load, such as a loudspeaker, SP1:A. A capacitor, C13, is connected in parallel with SP1:A and coupled between OUT1+ and OUT1−.

In the upper half of A, the voltage signal at OUT1+ is fed back to X1 through two back-to-back "Zener" diodes, Q1 and Q3, and a resistor, R6. And the minimum output voltage to turn on "Zener" diodes, Q1 and Q3 is |V1|. The feedback circuit through Q1, Q3, and R6 is cut off as long as the absolute value of output voltage at OUT1+ is less than |V1|. The close-loop gain of the amplifier A is equal to $R_f/R_i$. When the output voltage at OUT1+ exceeds V1 or less than −V1, Q1 and Q3 are turned on and the feedback circuit through Q1, Q3, and R6 is connected. The close-loop gain of the upper half of A is reduced to $R_f'/R_i$. $R_f'$ is the effective resistance of two parallel circuits. One of two parallel circuits is R5 and R9 in series with grounded C9. The other circuit is R6, Q1, and Q3 in series. $R_f'$ is less than either (R5+R9) or (R6+$R_{Q1}$+$R_{Q3}$). As a result, the close-loop gain of the upper half of A is reduced when the output voltage at OUT1+ exceeds V1 or less than −V1.

In the lower half of A, the voltage signal at OUT1− is fed back to X2 through two back-to-back "Zener" diodes, Q2 and Q4, and a resistor, R8. And the minimum output voltage to turn on "Zener" diodes, Q2 and Q4 is |V1|. The feedback circuit through Q2, Q4, and R8 is cut off as long as the absolute value of output voltage at OUT1− is less than |V1|. The close-loop gain of the lower half of A is also equal to $R_f/R_i$. When the output voltage at OUT1− exceeds V1 or less than —V1, Q2 and Q4 are turned on and the feedback circuit through Q2, Q4, and R8 is connected. The close-loop gain of the lower half of A is reduced to $R_f''/R_i$. $R_f''$ is the effective resistance of two parallel circuits. One of two parallel circuits is R7 and R10 in series with grounded C10. The other circuit is R8, Q2, and Q4 in series. $R_f''$ is less than either (R7+R10) or (R8+$R_{Q2}$+$R_{Q4}$). As a result, the close-loop gain of the lower half of A is reduced when the output voltage at OUT1− exceeds V1 or less than −V1. Thus, the circuit produces clean output voltages without low frequency oscillations.

In present invention, an additional feedback circuit is introduced between an amplifier circuit and an output stage. The feedback circuit couples input terminals of the amplifier circuit and either the output terminals of the amplifier circuit or the output terminals of the output stage. It is normally turned off as long as the absolute value of output voltages is less than a preset value, |V1|. When the value of output voltages are over |V1| or near saturation condition, it is turned on. Since the additional feedback circuit is in parallel with an existing feedback circuit, the effective resistance of the feedback circuit is reduced once the additional feedback circuit is turned on. Hence, the closed-loop gain of the amplifier circuit is reduced when output voltages are near saturation. Output voltages have less gain and become more curved when the values of output voltage are over |V1| or near saturation. As a result, audio noises are greatly reduced or eliminated when output signals are near saturation.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. Other variations and modifications of the embodiments disclosed herein may be made without departing from the scope and spirit of the invention.

We claim:

1. A method of achieving a high proficiency audio amplifier having an amplifier control stage, a feedback circuit, and an output stage, comprising:
   providing an audio input signal;
   deriving a differential voltage signal from said input signal, and providing said differential signal to said output stage through said amplifier control stage; and
   turning on said feedback circuit that adjusts the closed loop gain of said amplifier control stage whenever either one of said differential voltage signal at said output stage is substantially near saturation.

2. The method in claim 1, wherein said feedback circuit comprises an adjustable-gain circuit that adjusts the closed-loop gain of said amplifier control stage if either one of said differential voltage signal is near saturation.

3. The method in claim 2 wherein said adjustable-gain circuit further comprises an adjustable-resistance circuit that is coupled between said amplifier control stage and said output stage and adjusts its resistance if either one of said differential voltage signal is near saturation.

4. The method in claim 3 wherein said adjustable resistance circuit further comprises a resistance circuit that only turns on if either one of said differential voltage signal is near saturation.

5. The method in claim 4 wherein said resistance circuit further comprises a resistor, and two back-to-back "Zener" diodes connected in series.

6. A method of achieving a high proficiency audio amplifier having an amplifier control stage, a feedback circuit, and an output stage, comprising:
   providing an audio input signal;
   deriving a differential voltage signal from said audio input signal through said amplifier control stage;
   filtering said differential voltage signal, and deriving a differential output signal through said output stage; and
   turning on said feedback circuit to adjust the closed loop gain of said amplifier control stage whenever either one of said differential output signal is substantially near saturation.

7. The method in claim 6 wherein said feedback circuit further comprises an adjustable-gain circuit that adjusts the closed-loop gain of said amplifier control stage if either one of said differential output signal is near saturation.

8. The method in claim 7 wherein said adjustable-gain circuit further comprises an adjustable-resistance circuit that is coupled between said amplifier control stage and said output stage and adjusts its resistance if either one of said differential output signal is near saturation.

9. The method in claim 8 wherein said adjustable resistance circuit further comprises a resistance circuit that only turns on if either one of said differential output signal is near saturation.

10. The method in claim 9 wherein said resistance circuit further comprises a resistor, and two back-to-back "Zener" diodes being connected in series.

11. A circuit, comprising:
   a differential amplifier control stage to receive an audio input signal and generate a differential voltage signal;
   an output stage to filter said differential voltage signal and produce a differential output voltage signal; and
   a feedback circuit, being coupled between said differential amplifier control stage and said output stage, wherein said feedback circuit further comprises an adjustable gain circuit that only turns on if either one of said differential output signal is near saturation.

12. The circuit in claim 11, wherein said adjustable-gain circuit adjusts the close-loop gain of said differential amplifier control stage if either one of said differential output signal is near saturation.

13. The circuit in claim 11 wherein said adjustable-gain circuit further comprises an adjustable-resistance circuit that adjusts its resistance if either one of said differential output signal is near saturation.

14. The circuit in claim 13 wherein said adjustable resistance circuit further comprises a resistance circuit that is coupled between said differential amplifier control stage and said output stage and only turns on if either one of said differential output signal is near saturation.

15. The circuit in claim 14, wherein said resistance circuit further comprises a resistor, and two back-to-back "Zener" diodes being connected in series.

16. The circuit in claim 11 wherein said feedback circuit turns on if either one of said differential voltage signal is near saturation.

17. The circuit in claim 16 wherein said feedback circuit comprises an adjustable-gain circuit that adjusts the closed-loop gain of said amplifier control stage if either one of said differential voltage signal is near saturation.

18. The circuit in claim 17 wherein said adjustable-gain circuit further comprises an adjustable-resistance circuit that adjusts its resistance if either one of said differential voltage signal is near saturation.

19. The circuit in claim 18 wherein said adjustable resistance circuit comprises a resistance circuit that is coupled between said differential amplifier control stage and said output stage and only turns on if either one of said differential voltage signal is near saturation.

20. The circuit in claim 19 wherein said resistance circuit comprises a resistor, and two back-to-back "Zener" diodes connected in series.

21. The method of claim 1 further comprising filtering said differential voltage signal and obtaining a differential output signal through said output stage.

* * * * *